United States Patent
Hales

(10) Patent No.: US 6,850,180 B2
(45) Date of Patent: Feb. 1, 2005

(54) ASYNCHRONOUS SELF-TIMED ANALOG-TO-DIGITAL CONVERTER

(75) Inventor: Rex K. Hales, Salt Lake City, UT (US)

(73) Assignee: SLICEX, Inc., Salt Lake City, UT (US)

(*) Notice: Subject to any disclaimer, the term of this patent is extended or adjusted under 35 U.S.C. 154(b) by 0 days.

(21) Appl. No.: 10/407,956

(22) Filed: Apr. 3, 2003

(65) Prior Publication Data

US 2003/0218561 A1 Nov. 27, 2003

Related U.S. Application Data

(60) Provisional application No. 60/369,825, filed on Apr. 3, 2002.

(51) Int. Cl.[7] .................................................. H03M 1/34
(52) U.S. Cl. ...................... 341/162; 341/155; 341/159; 341/163
(58) Field of Search ............................... 341/155–156, 341/158–159, 162–163

(56) References Cited

U.S. PATENT DOCUMENTS

| | | | | |
|---|---|---|---|---|
| 3,858,200 A | * | 12/1974 | Henry | 341/159 |
| 5,014,057 A | * | 5/1991 | Mintzer | 341/161 |
| 6,154,163 A | * | 11/2000 | Rossi et al. | 341/161 |
| 6,404,372 B1 | * | 6/2002 | Heithoff | 341/155 |

FOREIGN PATENT DOCUMENTS

GB 2228155 A * 8/1990 ............ H03M/1/42

* cited by examiner

Primary Examiner—Michael Tokar
Assistant Examiner—Khai Nguyen
(74) Attorney, Agent, or Firm—Steven L. Nichols; Rader, Fishman & Grauer PLLC

(57) ABSTRACT

An analog-to-digital converter that does not use an external clock signal to convert an incoming analog signal to a digital output signal including two or more comparators configured to receive an analog input signal, a digital-to-analog converter configured to produce a reference signal for the comparators, and asynchronous logic configured to sample comparator results and adjust a digital output signal accordingly.

29 Claims, 6 Drawing Sheets

ASYNCHRONOUS SELF-TIMED ANALOG-TO-DIGITAL CONVERTER

RELATED APPLICATIONS

The present application claims priority under 35 U.S.C. §119(e) from the following previously-filed Provisional Patent Application, U.S. application No. 60/369,825, filed Apr. 3, 2002 by Rex K. Hales, entitled "Asynchronous/self Timed Analog to Digital Converter," and which is incorporated herein by reference in its entirety.

FIELD

The present invention relates to the field of analog-to-digital converters. More specifically, the present invention presents an asynchronous self-timed analog-to-digital converter.

BACKGROUND

Many electrical applications require analog-to-digital conversions that consume extremely low power. Traditionally, these analog-to-digital conversions have been performed using many different architectures and methods. All of these methods require a system clock to synchronize the execution of the analog-to-digital conversion. While the system clock aids in the system control, system clocks tend to consume relatively large amounts of power. For example, there are a number of applications, such as complementary metal-oxide semiconductor (CMOS) technologies, in which clock power is a very large contributor to the over all power consumed by the application.

The exact method used to achieve an analog-to-digital conversion vanes with each architecture. The power consumed by an analog-to-digital converter (ADC) depends on the components incorporated in each architecture. In addition to clocks, components such as comparators may consume power. When receiving an analog input signal, reference voltages or currents of comparators may be compared to a received input signal to determine which reference is closest to the input signal for conversion. Each time a comparator performs this function, power is consumed.

In order to reduce the power consumption requirements of systems that perform analog to digital conversions, many system architectures have been designed with the aim of reducing the number of comparators and/or references required. One such system architecture, the pipelined architecture, uses small flash ADCs in concert with a digital to analog converter (DAC). The output of the first flash ADC is converted back to an analog signal by a DAC and summed with the input signal. This intermediate signal is then multiplied by a scaling factor and fed into the next stage of the pipeline resulting in an analog-to-digital conversion. The pipelined architecture approach has been used successfully; however, it is disadvantageous in that the pipelined system requires the intermediate signals be generated regardless of whether the input is changing, often resulting in unnecessary power usage.

Another traditional approach, the successive approximation register (SAR), reduces the total number of power consuming components by using a single comparator to compare the input signal to multiple references, typically using a binary search pattern. This architecture reduces the power requirement of the logic in that the logic only changes state if there is a reason. However, SAR still requires a clock signal to determine when a change of states is allowed.

SUMMARY

The present invention meets the above-described needs and others. Specifically, one of many embodiments of the present invention provides a method in which an analog-to-digital converter (ADC) continuously monitors an input signal and changes state in response to input changes, independent of changes in a system clock (which may or may not be connected to the ADC). Since changes in the control logic state are controlled by the input signal, rather than a clock, the ADC only uses power when necessary due to input changes.

In an additional embodiment, the present invention provides an analog-to-digital converter including two or more comparators configured to receive an analog input signal, a digital-to-analog converter communicatively coupled to the comparators, wherein the digital-to-analog converter is configured to produce a reference signal for the comparators; and asynchronous logic configured to sample an output signal from the comparators and to adjust a digital output signal based on the sampled comparator output signal. According to this embodiment, a digital output signal from the asynchronous logic is fed through the digital-to-analog converter to produce the reference signal. Moreover, the analog-to-digital converter does not use an external clock signal to adjust the digital output signal based on the analog input signal.

Additional advantages and novel features of the invention will be set forth in the description which follows or may be learned by those skilled in the art through reading these materials or practicing the invention. The advantages of the invention may be achieved through the means recited in the attached claims.

BRIEF DESCRIPTION OF THE DRAWINGS

The accompanying drawings illustrate preferred embodiments of the present invention and are a part of the specification. Together with the following description, the drawings demonstrate and explain the principles of the present invention. The illustrated embodiments are examples of the present invention and do not limit the scope of the invention.

Throughout the drawings, identical reference numbers designate identical elements.

DETAILED DESCRIPTION

An apparatus and a method for low power conversion of an analog signal into a digital representation are described herein. According to one exemplary implementation, described more fully below, an asynchronous analog-to-digital converter (ADC) that does not require an external clock is presented. The present asynchronous ADC may reduce the number of power consuming components while causing substantially no latency in the ADC.

In the following description, for purposes of explanation, numerous specific details are set forth in order to provide a thorough understanding of the asynchronous ADC. It will be apparent, however, to one skilled in the art that the asynchronous ADC disclosed herein may be practiced without these specific details. Reference in the specification to "one embodiment" or "an embodiment" means that a particular feature, structure, or characteristic described in connection with the embodiment is included in at least one embodiment of the invention. The appearance of the phrase "in one embodiment" in various places in the specification are not necessarily all referring to the same embodiment.

The present ADC may be incorporated into any apparatus where power consumption is a concern. Exemplary applications may include, but are in no way limited to, battery level measurement (metering), communications, imaging, measurement, control systems, sensors, etc.

Figure 1:
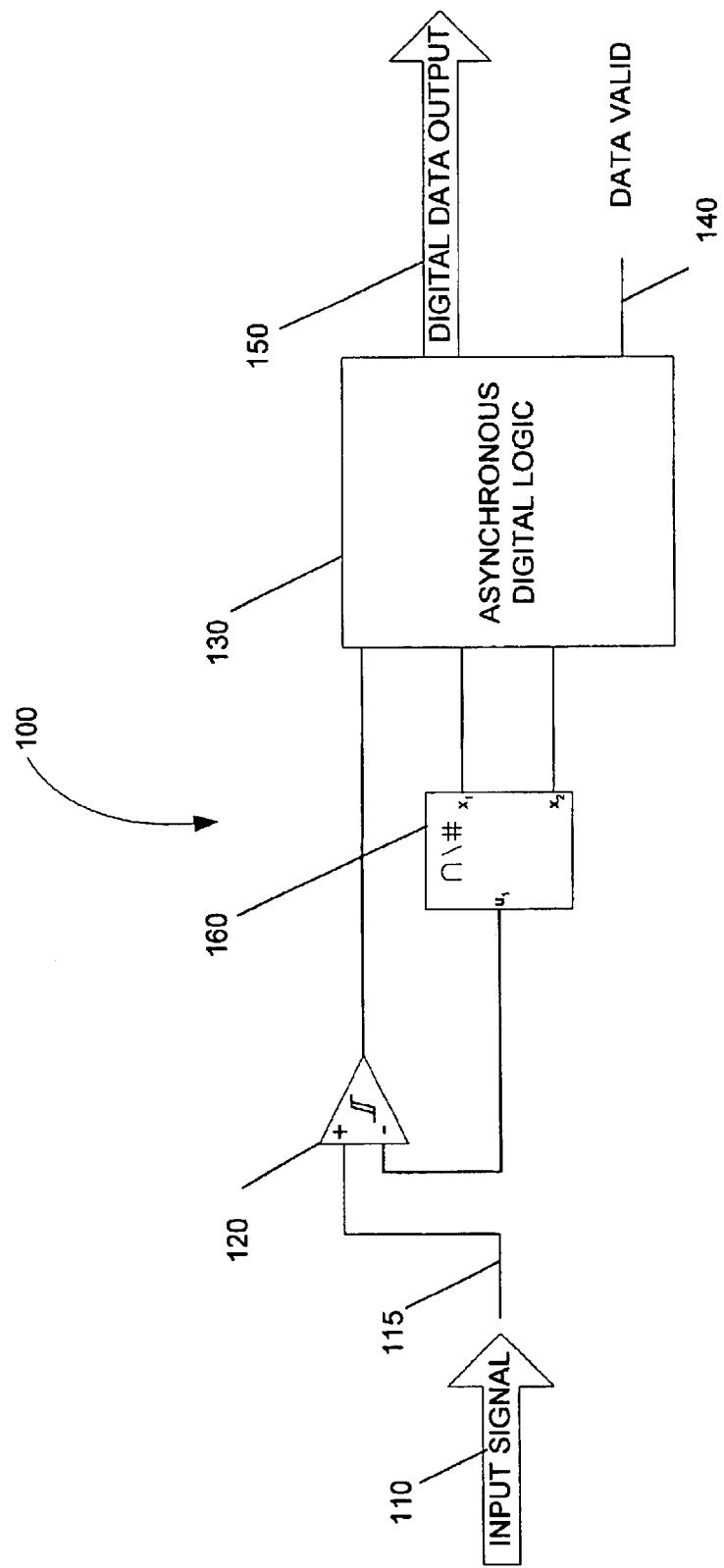
FIG. 1 is a simplified block diagram illustrating the basic construction of an asynchronous ADC according to one exemplary embodiment.

An exemplary embodiment of the present asynchronous ADC is illustrated in FIG. 1. As shown in FIG. 1, the asynchronous ADC (100) may include a comparator (120) communicatively coupled to both a signal input (115) and a reference digital-to-analog converter (DAC) (160). Both the comparator (120) and the reference DAC (160) may then be communicatively coupled to asynchronous digital logic (130) that includes both a digital data output (150) and a data valid indicator (140).

The comparator illustrated in FIG. 1 may be represented by any circuitry that may trigger a change in the digital output state of the present ADC in response to an analog input signal (110). As shown in FIG. 1, the present comparator (120) may have a number of inputs and an output. The comparator (120) is configured to adjust its output signal based on a comparison of an input analog signal (110) to a reference signal provided by a reference DAC (160).

The reference DAC (160) that is communicatively coupled to the comparator (120) and the asynchronous digital logic (130), as illustrated in FIG. 1, may be configured to receive a digital signal from the asynchronous digital logic (130). The reference DAC (160) converts that signal into an analog signal that may then be transmitted to the comparator (120). The DAC (160) may be any component capable of performing digital-to-analog conversions at an appropriate speed and resolution including, but in no way limited to, an integrated circuit (IC), a programmable capacitor, etc.

The asynchronous digital logic (130) illustrated in FIG. 1 is configured to receive the output signal from the comparator (120) and convert it into a digital data output signal (150) similar to a digital counter. By removing any requirement for a clock, the incorporation of the asynchronous digital logic (130) allows the present ADC (100) to have the lowest power consumption possible. The digital data outputs (150) may be coupled to a host device (not shown) that may utilize, store, or transmit the digital data. Moreover, the data valid indicator (140) disposed on the asynchronous digital logic (130) allows a coupled host system (not shown) to determine when the analog input signal (110) is changing.

When the asynchronous ADC (100) illustrated in FIG. 1 receives an analog input signal (110), the analog input signal (110) is presented to the input (115) of the comparator (120). The comparator performs a comparison between the analog input signal (110) and a reference signal produced by the reference DAC (160). If the analog input signal (110) is higher than the reference signal, the comparator (120) produces a high output that is transmitted to the asynchronous digital logic (130). Once received by the asynchronous digital logic, the comparator output signal causes the asynchronous digital logic (130) to increment and provide a larger digital signal to both the digital outputs (150) and back to the reference DAC (160).

In response to the larger digital signal, the output produced by the reference DAC (160) rises in response to the increased digital signal thereby providing a higher reference signal for comparison in the comparator (120). Once the asynchronous digital logic (130) has been incremented, it does not recognize another output signal from the comparator until enough time has passed for the reference voltage of the reference DAC (160) to settle. This handshaking method allows one stage to determine that the previous stage has finished its computation before starting on its own. This method may also assure that a succeeding stage has accepted its information before going on to look for more input data.

The present asynchronous ADC (100) uses this handshaking method to determine when the DAC output is stable and ready for another comparison with the analog input signal (110). The reference signal from the DAC may be generated by a simple delay chain designed to delay sufficiently between the production of reference signals to allow the DAC to settle. This delay chain allows for complete separation of the present asynchronous ADC (100) from the system clock normally used to time the DAC settling. Since the present asynchronous digital logic uses common self-timing techniques, no clock is necessary, thereby reducing power consumption and part count.

Figure 2A:
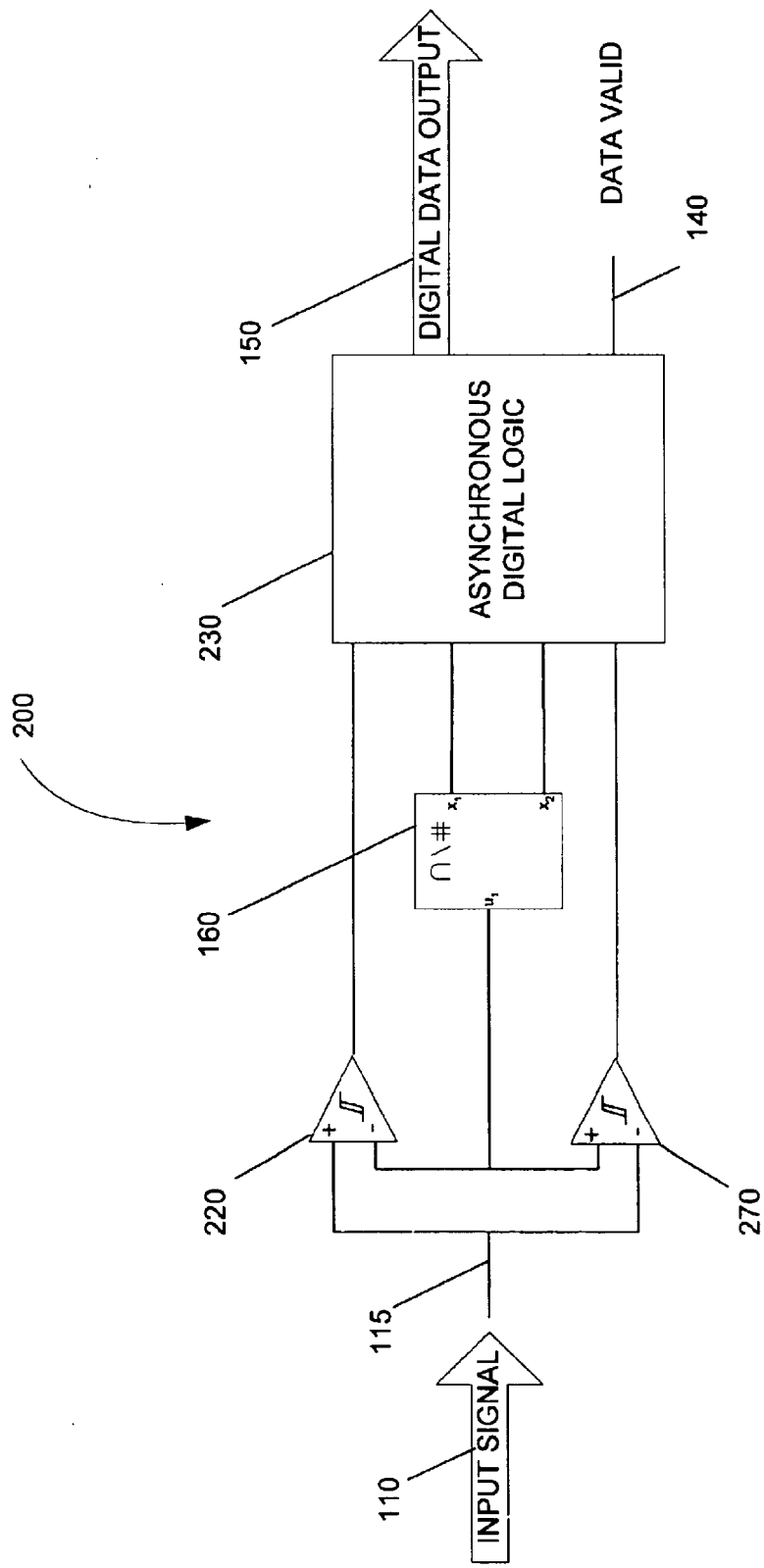
FIG. 2A is a simplified block diagram illustrating a second embodiment of an asynchronous ADC according to one exemplary embodiment.

An additional embodiment of present asynchronous ADC (200) is illustrated in FIG. 2A. As shown in FIG. 2A, a first comparator (220) and a second comparator (270) may be used to compare the analog input signal (110) to the reference signal produced by the reference DAC (160). According to this embodiment, the asynchronous digital logic (230) is configured to recognize signals from each comparator (220, 270) and adjust the digital data output (150) differently depending on which comparator produces the signal.

Figure 2B:
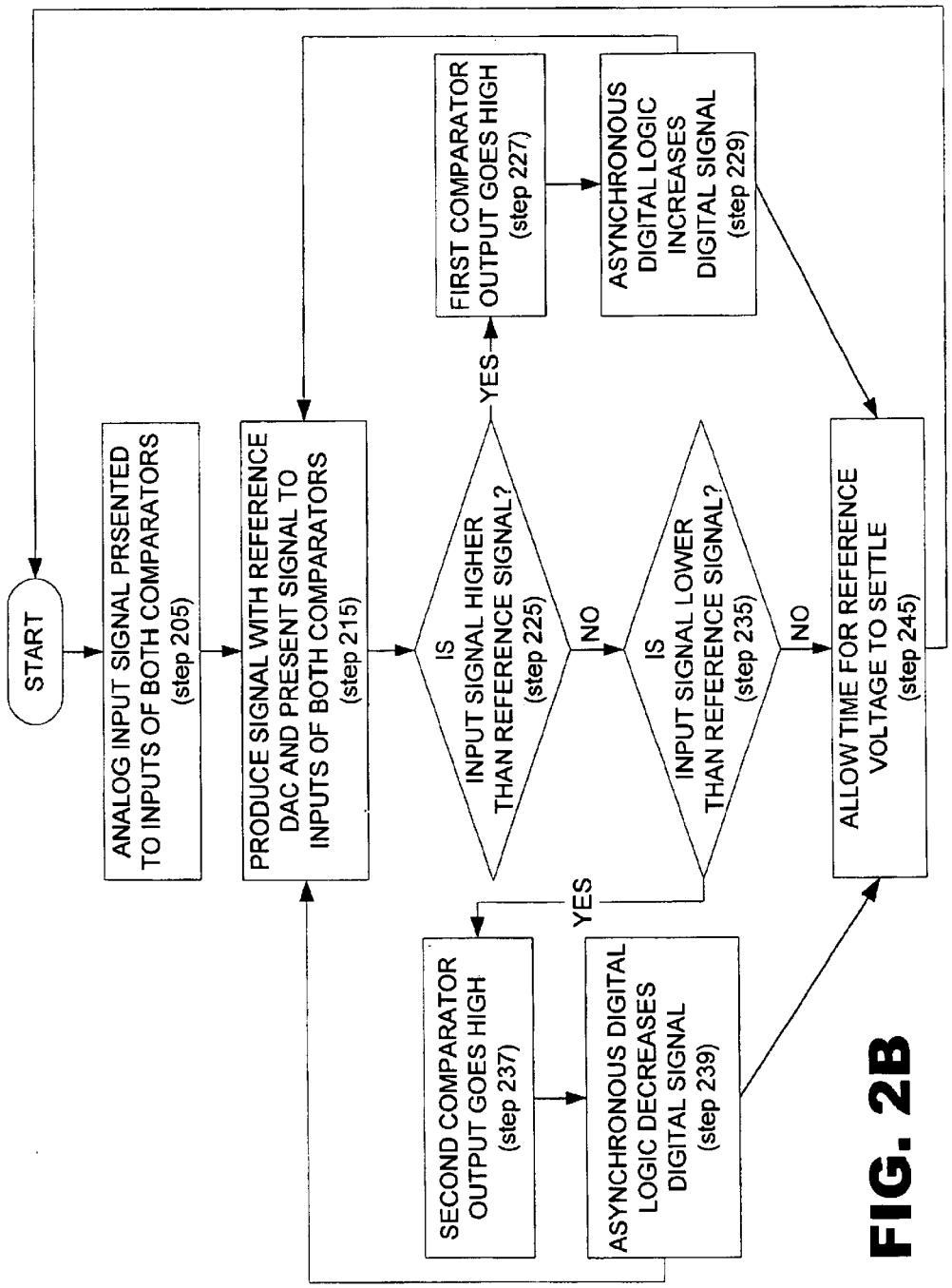
FIG. 2B is a flow chart illustrating an exemplary operation of an asynchronous ADC such as that illustrated in FIG. 2A.

FIG. 2B illustrates the operation of the additional embodiment of the asynchronous ADC (200) according to one exemplary implementation. As shown in FIG. 2B, the operation begins by presenting an analog input signal (110; FIG. 2A) to the signal input (115; FIG. 2A) that leads to both comparators (step 205). A reference signal is produced by the reference DAC (160; FIG. 2A) which is also presented to both of the comparators (step 215). With both the analog input signal and the reference signal presented to the inputs of the comparators (220, 270; FIG. 2A), the outputs of the comparators may change in response.

If the analog input signal (110; FIG. 2A) goes above the reference signal generated by the reference DAC (YES, step 225), the output of the first comparator (220) changes to high (step 227). The change in the output is recognized by the asynchronous digital logic (230; FIG. 2A) triggering the asynchronous digital logic (230; FIG. 2A) to increment the value output on the digital output (step 229). This increase of the digital output (step 229) also changes the value received by the reference DAC (160; FIG. 2A) causing it to increase the reference signal. The increase in the reference signal may exceed the analog input signal causing the first comparator (220; FIG. 2A) to return to a low output value state.

Similarly, if the analog input signal (110; FIG. 2A) drops below the reference signal produced by the reference DAC (YES, step 235), the second comparator (270; FIG. 2A) will output a high value (step 237). The high output of the second comparator (step 237) will also be detected by the asynchronous digital logic (230; FIG. 2A) triggering the asynchronous digital logic (230; FIG. 2A) to decrement the value output to the digital output (step 239). In response to the decreased value of the digital output (step 239), the reference signal produced by the reference DAC (160; FIG. 2A) will also decrease. The decrease in the reference signal may cause the reference signal to drop to a value lower than the analog input signal (110; FIG. 2A) causing the second comparator (270; FIG. 2A) to return to a low output value state.

Once the asynchronous digital logic (230; FIG. 2A) has changed the digital output or has not received a high output value from any of the comparators (220, 270; FIG. 2A), the asynchronous digital logic waits a designated period of time to allow for the reference voltage of the reference DAC (160; FIG. 2A) to settle (step 245). This period of inactivity eliminates the need for a clock thereby reducing the power consumption as indicated above. After the designated period of time has expired, the reference DAC (160; FIG. 2A) again produces a reference signal and the signal conversion process is again initiated.

In order to reduce the effect of noise and other small deviations that may take place in an analog input signal, hysteresis may be designed into the comparators to allow for a range of deviation before a comparator changes its output value state. The range of deviations that are allowed before a comparator changes its output value state may be known as the least significant bit (LSB) value for the ADC. In addition to preventing signal deviations caused by noise, hysteresis may also allows multiple stages to be put together with different hysteresis ranges as illustrated in FIG. 3 resulting in DAC resolutions capable of tracking faster changing signals than would be possible with a single stage having a fixed LSB value.

Figure 3:
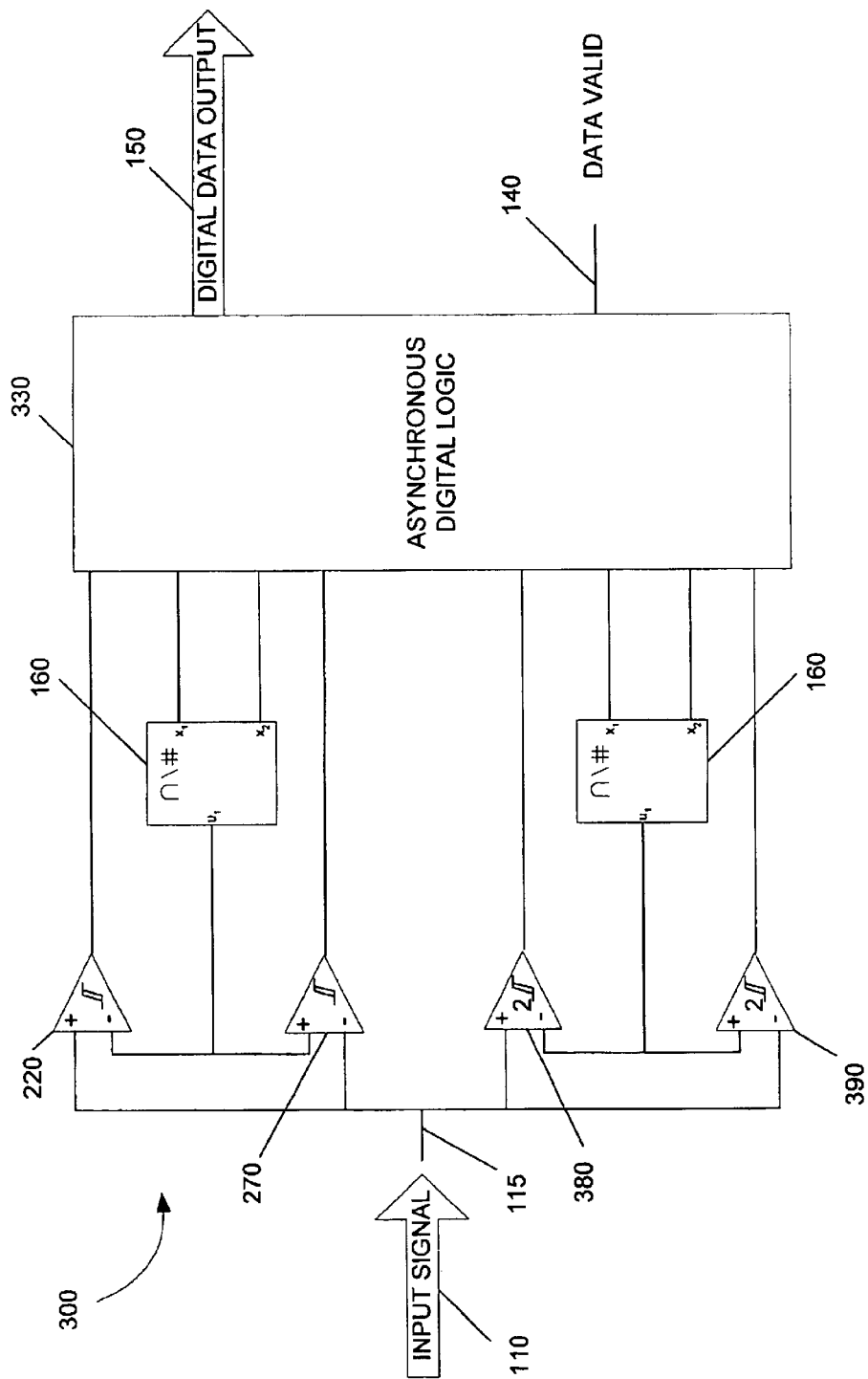
FIG. 3 is a simplified block diagram illustrating a third embodiment of an asynchronous ADC according to one exemplary embodiment.

The exemplary asynchronous ADC (300) illustrated in FIG. 3 operates similar to the embodiment illustrated in FIG. 2 when receiving small input signal changes. More specifically, if the analog input signal (110) received by the asynchronous ADC (300) changes above or below the reference signal provided by the reference DAC (160), the output from the first or second comparator (220 or 270) will become active, signaling the need for a change of the digital data output (150). The change in the digital data output (150) will subsequently change the reference signal to be adjusted between the thresholds of the comparators (220, 270).

In order to enhance the performance of the asynchronous ADC illustrated in FIG. 3, a third and a fourth comparator (380, 390) coupled to a reference DAC (160) are included. The third and fourth comparators (380, 390) have a wider threshold than the first and second comparators due to an increased hysteresis. The third (380) and fourth (390) comparators illustrated in FIG. 3 may have twice as much hysteresis (indicated by the 2) as the first (220) and second (270) comparators. The outputs of the third (380) and fourth (390) comparators will not become active unless a larger change in analog input signal (110) is received. An output of the third (380) or fourth (390) comparator will only become active when the analog input signal changes at a rate in excess of the reference DAC (160) settling time. An active output from the third (380) or fourth (390) comparators will signal the asynchronous digital logic (330) to increment or decrement the digital data signal (150) by a more significant bit. This greater increase or decrease in the digital data signal (150) will change the reference signal by a larger amount effectively increasing the speed of the asynchronous ADC (300).

The valid signal indicators (340, 341) shown in FIG. 3 may be used to notify the host system when the analog input signal (110) is changing. If the analog input signal (110) does not change, the reference signal remains between the comparator thresholds and their output states do not change. As a result, the signal to the asynchronous digital logic (330) does not change and no valid signal indicator (340, 341) is activated thereby signaling to the host system that the digital output is not valid. The asynchronous ADC (300) may remain in an idle condition until the analog input signal (110) goes above or below the threshold of any one of the comparators (220, 270, 380, 390), causing an adjustment of the digital data output (150) and the activation of a valid signal indicator (340, 341). This ability to remain in an idle condition when there is not a significant change in the analog input signal (110) further reduces the power consumption of the present asynchronous ADC. Additionally, the valid signal indicators (340, 341) allow the host system to ignore the ADC or even sleep until the analog input changes triggering the valid signal indicators (340, 341).

Moreover, the host system (not shown) may use the valid signal indicators (340, 341) to determine the accuracy of the current digital outputs by relating the active signal indicators (340, 341) with their corresponding LSB values. While many systems require only the highest accuracy, a number of systems may have varying accuracy requirements. The exemplary embodiment illustrated in FIG. 3 allows the host system to determine a required accuracy level prior to accepting the value received from the digital data output (150).

Figure 4:
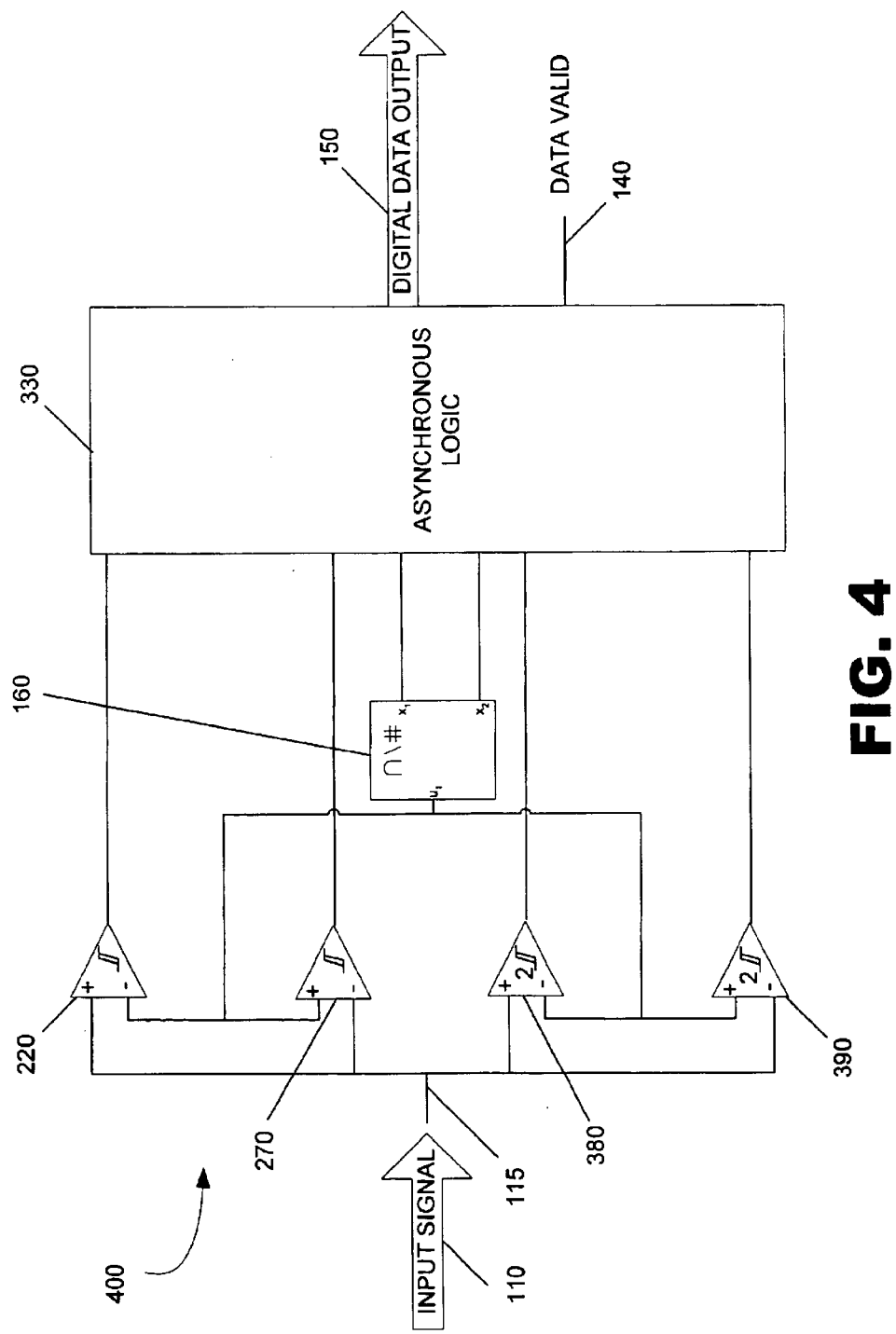
FIG. 4 is a simplified block diagram illustrating a fourth embodiment of an asynchronous ADC according to one exemplary embodiment.

While the exemplary embodiment illustrated in FIG. 3 shows a separate reference DAC (160) coupled to each pair of comparators (220, 270, 380, 390), a single reference DAC (160) may be used to supply the reference signal to all of the comparators (220, 270, 380, 390) as illustrated in FIG. 4. By using a single reference DAC (160) to supply the reference signal for the asynchronous ADC (400), the part count as well as the overall power consumption of the asynchronous ADC (400) may be reduced.

Figure 5:
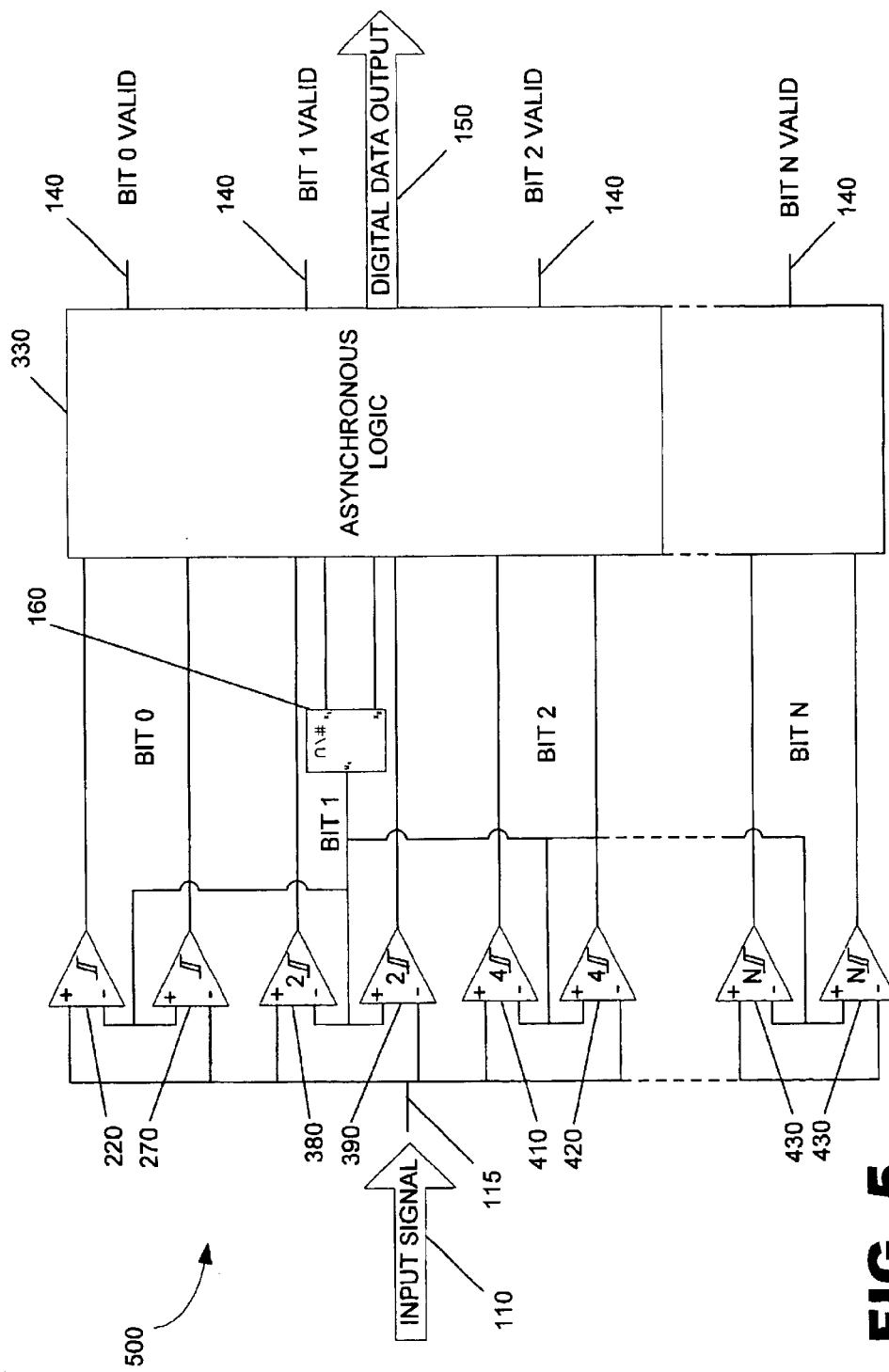
FIG. 5 is a simplified block diagram illustrating a fifth embodiment of an asynchronous ADC according to one exemplary embodiment.

Moreover, it is possible to include any number of comparators having varying hysteresis designed into them as illustrated in FIG. 5. The alternative embodiment illustrated in FIG. 5 includes the components described above plus the addition of more comparators (410, 420, 430) with increasing hysteresis designs. The alternative embodiment illustrated in FIG. 5 also has additional valid signal indicators (540, 541) corresponding to the additional comparator pairs respectively. According to the alternative embodiment illustrated in FIG. 5, each comparator pair represents a bit of data. When an analog input signal (110) is received by the asynchronous ADC (500), the configuration allows for the asynchronous digital logic to adjust the digital data output (150) in larger than steps corresponding to the LSB of the first and second comparators (220, 270). This ability to vary the output adjustment is useful when the analog input signal changes rapidly.

According to the alternative embodiment illustrated in FIG. 5, the asynchronous digital logic (330) is configured to determine both the bit of data that changes as well as the needed adjustment in the digital data output (150) to correspond to the change in the analog input signal (110). By way of example, if Bit N illustrated in FIG. 5 indicates a change, the asynchronous digital logic (330) will know that a $2^N$ change should be made on the digital data output (150).

Since the lower order bits may take longer to become valid, multiple valid signals on the valid signal indicators (340, 341, 540, 541) may be used by the host system to know how many bits are good at any one time. Unlike traditional ADCs, the asynchronous ADC illustrated in FIG. 5 may operate at its fastest speed under all conditions without requiring special circuits to reduce power due to a power vs. speed tradeoff. Moreover, a good power to accuracy trade off is automatically implemented for systems where accuracy is less important in fast moving signals because fewer components will be activated.

In conclusion, the present asynchronous ADC, in its various embodiments, reduces the component count and therefore the die area as compared to other ADC configurations. Additionally, the present system reduces the amount of power consumed by the ADC by only consuming power if the analog input signal changes rather than processing a new conversion with each clock cycle. Moreover, power is only consumed by the devices in the circuit that need to change state in order to provide the correct digital output. According to the many embodiments described above, the output is continuously updated to reflect the current value of the input signal, allowing for little or no latency in the ADC.

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. An analog-to-digital converter comprising:
    two or more comparators configured to receive an analog input signal;
    a digital-to-analog converter communicatively coupled to said comparators, wherein said digital-to-analog converter is configured to produce a reference signal for said comparators; and
    asynchronous logic configured to sample an output signal from said comparators and to adjust a digital output signal based on said comparator output signal, wherein said asynchronous logic also outputs a data valid indicator;
    wherein a digital output signal from said asynchronous logic is fed through said digital-to-analog converter to produce said reference signal;
    wherein said analog-to-digital converter does not use an external clock signal to adjust said digital output signal based on said analog input signal.

2. The analog-to-digital converter of claim 1, wherein said two or more comparators comprises:
    a first comparator configured to receive both said analog input signal and said output from said digital-to-analog converter, compare said input analog signal to said output from said digital-to-analog converter, and produce a signal if said output from said digital-to-analog converter is lower than said analog input signal; and
    a second comparator configured to receive both said analog input signal and said output from said digital-to-analog converter, compare said input analog signal to said output from said digital-to-analog converter, and produce a signal if said output from said digital-to-analog converter is greater than said analog input signal.

3. The analog-to-digital converter of claim 2, wherein said first and second comparators are designed with a measured hysteresis, said hysteresis defining a least significant bit.

4. The analog-to-digital converter of claim 1, further comprising:
    multiple pairs of comparators, wherein each pair of comparators includes a different hysteresis design to increase a conversion reaction speed of said analog-to-digital converter.

5. The analog-to-digital converter of claim 1, wherein if said analog input signal is not a least significant bit above or below said output from said digital-to-analog converter, said asynchronous logic remains in an inactive state.

6. The analog-to-digital converter of claim 1, wherein said asynchronous logic remains inactive for a designated settling period of time after an adjustment of said digital output in response to said comparator signals.

7. An apparatus comprising:
    an analog-to-digital converter including an analog-to-digital conversion circuit configured to receive an analog input signal, sample said analog input signal, and output a representative digital signal based on said sampling of said analog input signal, wherein said analog-to-digital conversion circuit does not receive or use a clock signal and outputs a data valid indicator; and
    a host device communicatively coupled to said analog-to-digital converter, wherein said host device is configured to receive said representative digital signal and said data valid indicator, said data valid indicator indicating to said host device when said analog input signal is changing.

8. The apparatus of claim 7, wherein said analog-to-digital converter further comprises:
    a plurality of comparators;
    a digital-to-analog converter communicatively coupled to said plurality of comparators; and
    asynchronous digital logic communicatively coupled to both said plurality of comparators and said digital to analog converter, wherein said asynchronous digital logic is configured to receive a signal from said plurality of comparators and adjust a digital output based on said signal.

9. The apparatus of claim 8, wherein said comparators are configured to:
    receive an analog input signal;
    compare said analog input signal to an output signal from said digital-to-analog converter; and
    transmit a signal to said asynchronous digital logic requesting a change in said digital output based on said comparison.

10. The apparatus of claim 9, wherein said comparators are designed with a measured hysteresis, said hysteresis defining a least significant bit.

11. The apparatus of claim 10, wherein said asynchronous digital logic further comprises an output signal indicator configured to transmit a signal to said host device when said analog-to-digital converter changes said digital output.

12. The apparatus of claim 11, wherein said output signal indicator is further configured to transmit signal accuracy information to said host device.

13. An asynchronous analog-to-digital converter comprising:
an analog-to-digital conversion circuit which receives an analog input signal and outputs a digital signal based on sampling of the analog input signal; wherein said conversion circuit changes state only when the input analog signal changes by more than a least significant bit (LSB), said conversion circuit comprising:
a plurality of comparator pairs, wherein each comparator pair is designed with a different hysteresis value;
a digital-to-analog converter communicatively coupled to said plurality of comparators configured to produce and transmit a digital reference signal to said comparators: and
asynchronous digital logic communicatively coupled to both said plurality of comparators and said digital-to-analog converter;
wherein said asynchronous digital logic is configured to receive a signal from said plurality of comparators and to adjust a digital output based on said signal.

14. An analog-to-digital converter comprising:
two or more signal comparison means for receiving and comparing an analog input signal to a reference signal;
a digital-to-analog conversion means for generating said reference signal; and
asynchronous logic configured to sample output signals from said signal comparison means and output a digital signal and a data valid indicator;
wherein a digital output from said asynchronous logic is fed through said digital-to-analog conversion means for generating said reference signal;
wherein said analog-to-digital converter does not use an external clock signal to convert an incoming analog input signal into a digital output signal.

15. The analog-to-digital converter of claim 14, wherein said two or more signal comparison means comprises:
a first comparator configured to receive both said input analog signal and said output from said digital-to-analog converter, compare said input analog signal to said output from said digital-to-analog converter, and produce a signal if said output from said digital-to-analog converter is lower than said input analog signal; and
a second comparator configured to receive both said input analog signal and said output from said digital-to-analog converter, compare said input analog signal to said output from said digital-to-analog converter, and produce a signal if said output from said digital-to-analog converter is greater than said input analog signal;
wherein said asynchronous logic adjusts said digital output in response to said comparator signals.

16. The analog-to-digital converter of claim 14, wherein said comparison means comprise a least significant bit value determined by the application of hysteresis.

17. A method for analog-to-digital conversion comprising:
receiving an analog input signal in a plurality of comparators;
receiving a reference signal in said plurality of comparators;
comparing said analog input signal and said reference signal using said plurality of comparators;
signaling a change of a digital output based on said signal comparisons without the use of a clock signal;
changing said digital output and said reference signal based on said signaled change; and
using multiple pairs of comparators with differing least significant bit values to enhance the responsiveness of said method to varying signal rates.

18. The method of claim 17, further comprising pausing said method for a predetermined settling period after changing a digital output based on said signal comparison.

19. An analog-to-digital converter comprising:
a single comparator configured to receive an analog input signal;
a digital-to-analog converter communicatively coupled to said comparator, wherein said digital-to-analog converter is configured to produce a reference signal for said comparator; and
asynchronous logic configured to sample an output signal from said comparator and to adjust a digital output signal based solely on said comparator output signal, wherein said asynchronous logic also outputs a data valid indicator;
wherein a digital output signal from said asynchronous logic is fed through said digital-to-analog converter to produce said reference signal.

20. The converter of claim 19, wherein said analog-to-digital converter; does not use an external clock signal to adjust said digital output signal based on said analog input signal.

21. An analog-to-digital converter comprising:
multiple pairs of comparators, wherein each pair of comparators includes a different hysteresis design to increase a conversion reaction speed of said analog-to-digital converter;
a digital-to-analog converter communicatively coupled to said comparators, wherein said digital-to-analog converter is configured to produce a reference signal for said comparators; and
asynchronous logic configured to sample output signals from said comparators and output a digital output signal based on said comparator output signals;
wherein a digital output signal from said asynchronous logic is fed through said digital-to-analog converter to produce said reference signal.

22. The converter of claim 21, wherein said asynchronous logic also outputs a data valid indicator.

23. The converter of claim 21, wherein said analog-to-digital converter does not use an external clock signal to adjust said digital output signal based on said analog input signal.

24. The converter of claim 21, further comprising an additional digital-to-analog converter, wherein each digital to analog converter provides said reference signal for a different pair of comparators.

25. The converter of claim 21, wherein said pairs of comparators comprise:

a first comparator configured to receive both said analog input signal and said output from said digital-to-analog converter, compare said input analog signal to said output from said digital-to-analog converter, and produce a signal if said output from said digital-to-analog converter is lower than said analog input signal; and a second comparator configured to receive both said analog input signal and said output from said digital-to-analog converter, compare said input analog signal to said output from said digital-to-analog converter, and produce a signal if said output from said digital-to-analog converter is greater than said analog input signal.

26. The converter of claim 25, wherein said first and second comparators are designed with a measured hysteresis, said hysteresis defining a least significant bit.

27. The converter of claim 21, wherein said asynchronous logic further comprises an output signal indicator configured to produce a signal when said asynchronous logic changes said digital output in response to a change in said analog input signal.

28. The converter of claim 21, wherein if said analog input signal is not a least significant bit above or below said output from said digital-to-analog converter, said asynchronous logic remains in an inactive state.

29. The converter of claim 21, wherein said asynchronous logic remains inactive for a designated settling period of time after an adjustment of said digital output in response to said comparator signals.

* * * * *